United States Patent [19]
McClure

[11] Patent Number: 5,995,444
[45] Date of Patent: Nov. 30, 1999

[54] EDGE TRANSITION DETECTION CONTROL OF A MEMORY DEVICE

[75] Inventor: David Charles McClure, Carrollton, Tex.

[73] Assignee: STMicroelectronics, Inc., Carrollton, Tex.

[21] Appl. No.: 09/000,547

[22] Filed: Dec. 30, 1997

[51] Int. Cl.[6] .................................................. G11C 8/00
[52] U.S. Cl. .............................. 365/233.5; 365/189.08; 327/36; 327/38
[58] Field of Search .................. 365/233.5, 194, 365/189.08; 327/38, 36, 172, 176, 291, 293

[56] References Cited

U.S. PATENT DOCUMENTS

| | | | |
|---|---|---|---|
| 5,418,479 | 5/1995 | Sambandan | 326/93 |
| 5,553,033 | 9/1996 | McAdams | 365/233.5 |
| 5,625,604 | 4/1997 | Kim | 365/233.5 |
| 5,627,796 | 5/1997 | Park | 365/233.5 |
| 5,696,463 | 12/1997 | Kwon | 327/172 |
| 5,734,282 | 3/1998 | Choi | 327/227 |

*Primary Examiner*—Son Mai
*Attorney, Agent, or Firm*—Theodore E. Galanthay; Lisa K. Jorgenson; Renee M. Larson

[57] ABSTRACT

The pulse width of an internal edge transition detection signal of a memory device is selectably varied by varying the logic state of one or more control signals of the memory device. A number of edge transition detection signals generated by input buffers of the memory device are wire-configured together, such as by a wired-NOR or a wired-NAND configuration, to generate one or more edge transition detection busses. The one or more edge transition detection busses, together with two or more control signals, are introduced to an edge transition detection driver that determines the logic state of a device edge transition detection signal that is generated for use by the entire memory device. Changing the combination of logic states of the control signals allows the pulse width of the device edge transition detection signal to be selectably varied.

47 Claims, 3 Drawing Sheets

EDGE TRANSITION DETECTION CONTROL OF A MEMORY DEVICE

BACKGROUND OF THE INVENTION

The present invention relates generally to integrated circuit memory devices, and more particularly to the edge transition detection signal generated internal to an integrated circuit memory device.

Of concern in memory devices, such as asynchronous SRAM devices, that affects device performance and potentially device yield is the pulse width of an Edge Transition Detection (ETD) signal of the device. The ETD signal is often used in asynchronous SRAM devices as the internal clock of the device so that the device may operate in a synchronous manner internally. The ETD pulse controls such functions as the clocking of sense amplifiers of the device.

The duration of the ETD pulse is often of critical concern to the proper operation of the memory device. If the ETD pulse is too narrow, inadequate equilibration can occur, causing the device to slow or to fail, in the case of a device employing dynamic sense amplifiers. Conversely, if the ETD pulse is too wide, the device will be slower than it needs to be. The ETD pulse may need to be quite narrow, on the order of 1 to 3 nS, for instance. However, the ETD pulse is often subject to RC limitations as it is bussed around the device and this can degrade the ETD signal to an unacceptable level.

Due to the critical nature of the ETD signal, there is currently an unmet need in the art to be able to control the duration of an ETD pulse of a memory device as desired. Different ETD pulse widths would provide the advantage of being able to discover an optimal ETD pulse width with regard to device speed or yield.

SUMMARY OF THE INVENTION

It is therefore an object of the invention to be able to control the width of an ETD pulse of a memory device.

It is further an object of the invention to be able to selectively change the width of an ETD pulse of a memory device.

Therefore, according to the present invention, a method and structure for generating a selectably variable device edge transition detection signal of a memory device is disclosed. The method of the present invention includes generating a plurality of edge transition detection signals of the memory device; combining the plurality of edge transition detection signals together to form an edge transition detection bus; and generating a device edge transition detection signal of the device, having a selectably variable pulse width, from the edge transition detection bus in accordance with a plurality of control signals.

The structure of the present invention, useful for defining the selectably variable ETD pulse, includes: input buffer circuits of the memory device that generate edge transition detection signals; means for combining the edge transition detection signals to form an edge transition detection bus; and an edge transition detection driver circuit that generates a device edge transition detection signal with variable pulse width given two or more control signals and the edge transition detection bus as input signals.

In both the method and structure of the present invention, the pulse width of the device edge transition detection signal is selectably varied by varying the logic state of one or more of the control signals. For instance, in the embodiment of the present invention, when a first control signal is equal to a first logic state, such as a low logic state, a first pulse width of the device edge transition detection signal is defined; when the first control signal is equal to a second logic state, such as a high logic state, and a second control signal is equal to the first logic state, a second, wider pulse width of the device edge transition detection signal is defined; and when the first control signal and the second control signal are the second logic state, a third pulse width of the device edge transition detection signal that is wider than the second pulse width is defined. Of course, one skilled in the art will recognize that with minor modifications to the circuitry, the first logic state could be high and the second logic state could be high.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawing(s), wherein:

DESCRIPTION OF THE INVENTION

Due to the critical nature of a memory device's ETD pulse, a test mode of the present invention provides for varying widths of an ETD pulse of a memory device to be selectively produced. The present invention, through a test mode of the memory device, allows the optimal ETD pulse width in terms of certain device characteristics, such as speed or yield, to be determined. This test mode can be used to advantage for a variety of purposes, including device verification and debugging, diagnosis, such as evaluating failed bits, and testing of the device. For instance, the device may be tested with various ETD pulse widths in order to determine an optimal best pulse width for speed and an optimal pulse width for yield. The optimal pulse width could then be programmed into the memory device by a variety of methods, such as by blowing fuses or exercising bonding options of the device. The present invention is useful for both slow and fast memory devices.

Figure 1:
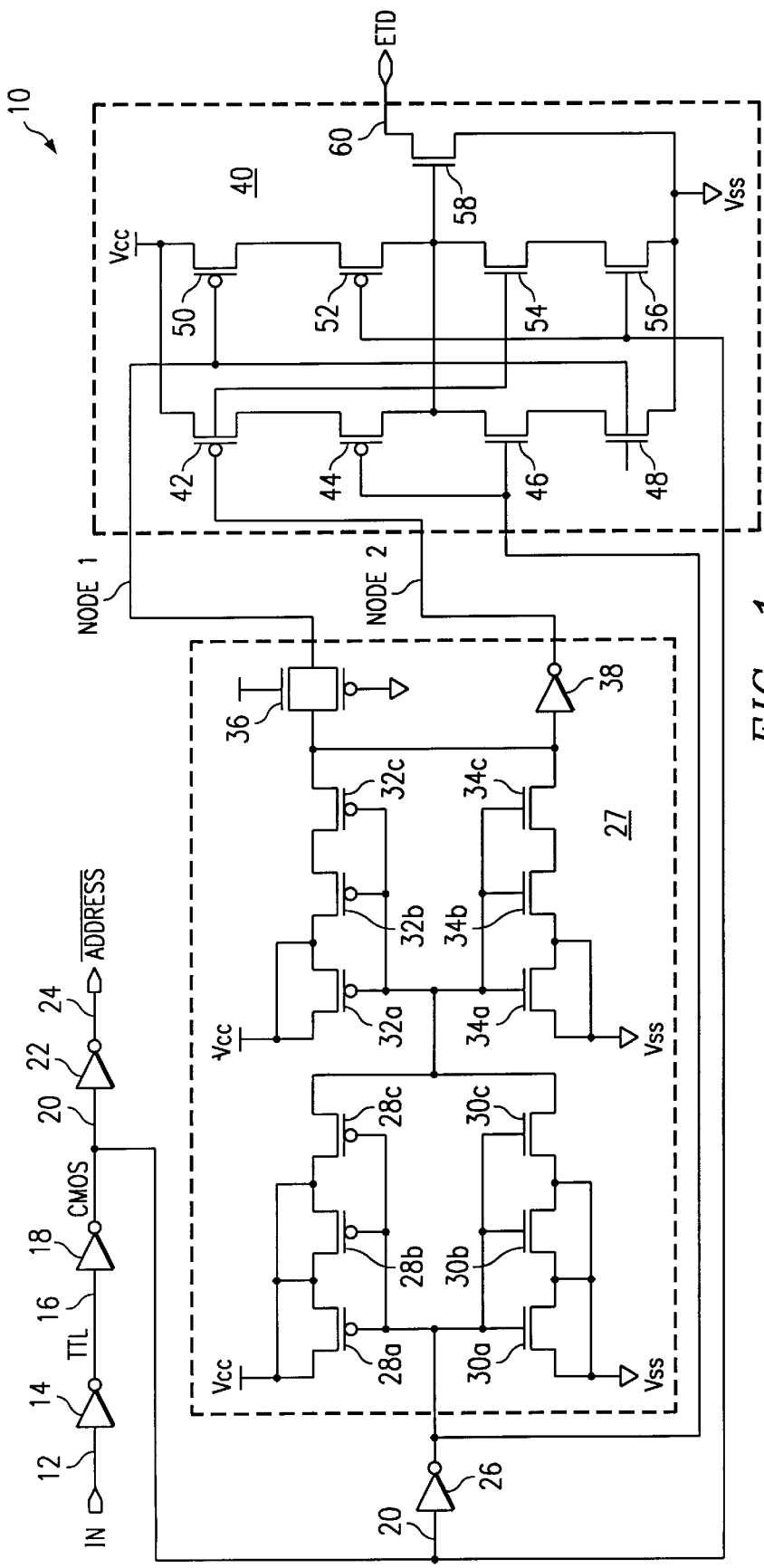
FIG. 1 is an input buffer circuit having an ETD output signal, according to the present invention.

Referring to FIG. 1, an address input buffer 10 with an ETD output signal 60 is shown. IN input signal 12 is provided to a first inverter 14 that operates as a TTL input buffer to generate a TTL output signal 16. Signal 16 is provided to a second inverter 18 that operates as a CMOS input buffer to generate a CMOS signal 20. Inverter 22 inverts signal 20 to produce Address bar signal 24. Address bar signal 24 is provided to pre-decoder circuitry of the memory device, such as columns and wordlines.

Figure 2:
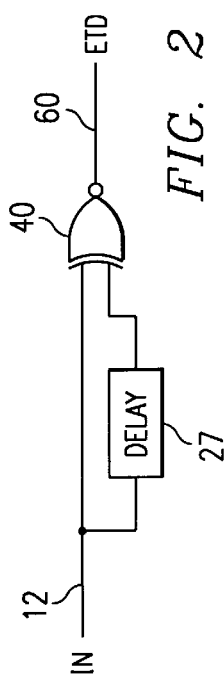
FIG. 2 is an electrical schematic of the logical equivalent of the address input buffer of FIG. 1, according to the present invention.

Signal 20 is provided to delay element 27 and exclusive NOR logic gate 40. Delay element 27 is composed of p-channel transistors 28a–c, n-channel transistors 30a–c, p-channel transistors 32a–c, and n-channel transistors 34a–c, passgate 36, and inverter 38. Passgate 36 is chosen to introduce the same delay as inverter 38 such that the signal at node 1 matches the signal at node 2. In other words, the delay associated with the signal at node 1 is equal to the delay associated with the signal at node 2. The logical equivalent of FIG. 1 is illustrated in FIG. 2. IN signal 12 is a first input signal to exclusive NOR logic gate 40 and the output of delay element 27 is a second input signal to exclusive NOR logic gate 40. The output of exclusive NOR logic gate 40 is ETD signal 60. ETD signal 60 is a low-going pulse on any transition of the input signal, IN signal 12.

The address input buffer circuit 10 of FIG. 1 is duplicated for all input buffers of the memory device. The ETD output signals 60 produced by the various input buffer circuits 10 of the memory device are combined to form a bus. ETD output signals 60 may be combined by a wired-configuration, such as wired-NAND, or otherwise. When any ETD output signal 60 is low, the bus is low.

Figure 3:
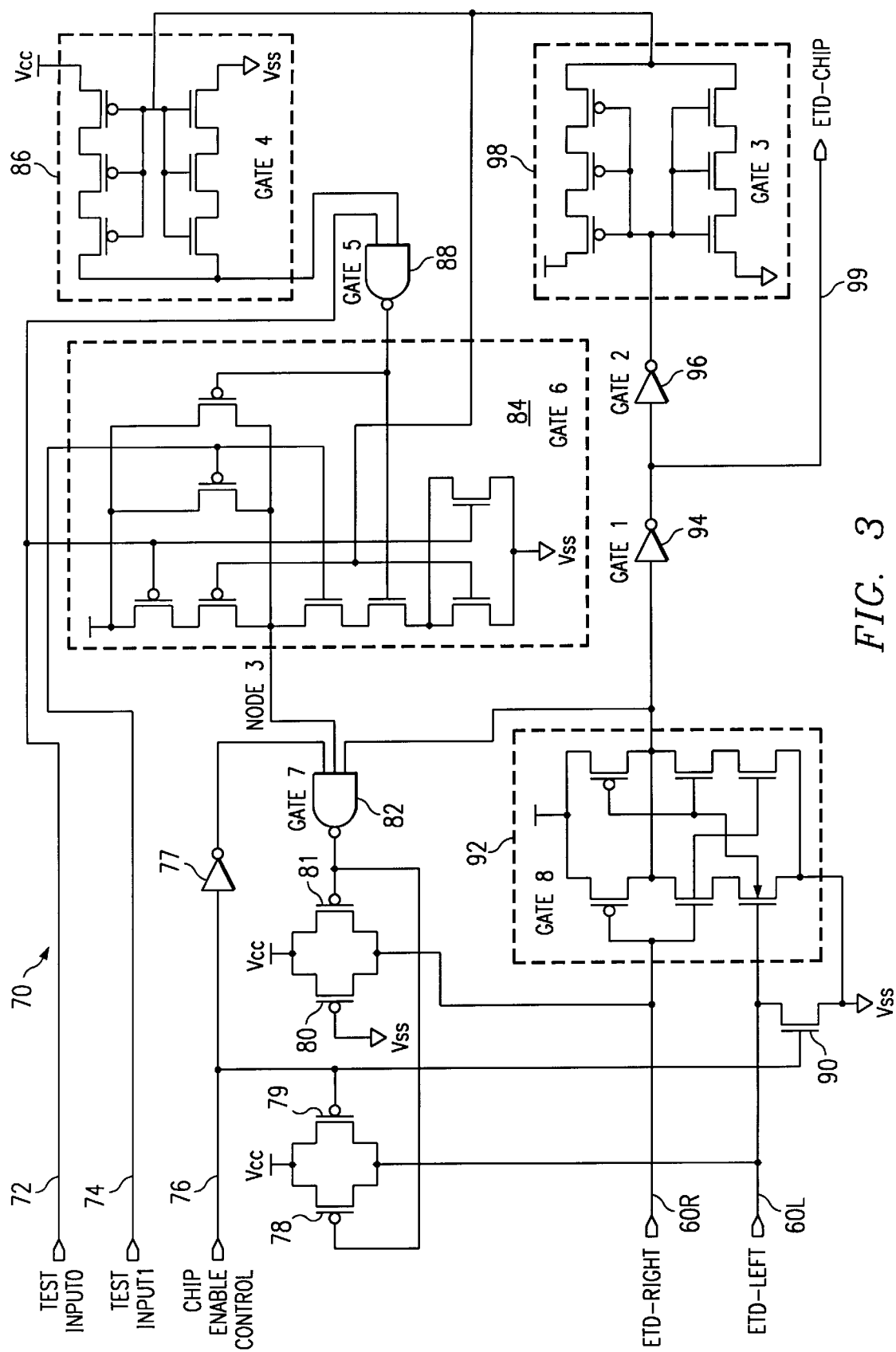
FIG. 3 is an edge transition detection driver circuit that produces an ETD-chip signal, according to the present invention.

Referring to FIG. 3, an Edge Transition Detection (ETD) Driver circuit 70 that produces ETD-chip signal 99, the ultimate ETD clock signal to be bussed about the chip, is illustrated. ETD Driver circuit 70 receives several input signals, including Test Input0 signal 72, Test Input1 signal 74, Chip Enable Control signal 76, ETD-Right bus 60R, and ETD-Left bus 60L. Chip Enable Control signal 76 is low when the chip is enabled. ETD-Right bus 60R is representative of the combined ETD signals 60 of the right side of the chip while ETD-Left bus 60L is representative of the combined ETD signals 60 of the left side of the chip. Circuit 70 is comprised of inverter 77, transistors 78, 79, 80, 81, 90, and gates Gate 1, Gate 2, Gate 3, Gate 4, Gate 5, Gate 6, Gate 7, and Gate 8.

The operation of ETD Drive circuit 70 dictates that the pulse width of ETD-chip 99 is determined by the states of Test Input0 signal 72 and Test Input1 signal 74 so long as Chip Enable Control signal 76 has enabled the memory device. ETD busses 60R and 60L are recovered by transistors 78 and 81; the delay network controlled by Test Input0 signal 72, Test Input1 signal 74, ETD-Right 60R, and ETD-Left 60L operate to control transistors 78 and 81. If Test Input1 signal 74 is low, the feedback to p-channel transistors 78 and 81 is through Gate 7, NAND gate 82, and Gate 8; if either ETD-Right bus 60R or ETD-Left bus 60L goes low, transistors 78 or 81 will pull high to recover these signals. If Test Input0 signal 72 is low and Test Input1 signal 74 is high, then the feedback path to recover the busses ETD-Right 60R and ETD-Left 60L is through gates Gate 8, Gate 1, Gate 2, Gate 3, Gate 6, and Gate 7, thereby making the effective pulse width of ETD-chip 99 wider than when Test Input1 signal 74 is low. If Test Input0 signal 72 is high and Test Input1 signal 74 is high, the feedback path to recover ETD-Right 60R and ETD-Left 60L busses is through gates Gate 8, Gate 1, Gate 2, Gate 3, Gate 4, Gate 5, Gate 6, and Gate 7. This combination of signals 72 and 74 renders the pulse width of ETD-chip 99 even wider.

The following table illustrates the combinations of Test Input0 signal 72 and Test Input1 signal 74 that will render varying pulse widths of ETD-chip signal 99.

| Test Input0 signal 72 | Test Input1 signal 74 | ETD-chip signal 99 |
| --- | --- | --- |
| X | 0 | narrowest pulse width |
| 0 | 1 | medium pulse width |
| 1 | 1 | widest pulse width |

It should be noted that "X" is a don't care condition for Test Input0 signal 72 since Node 3 is locked high.

Figure 4:
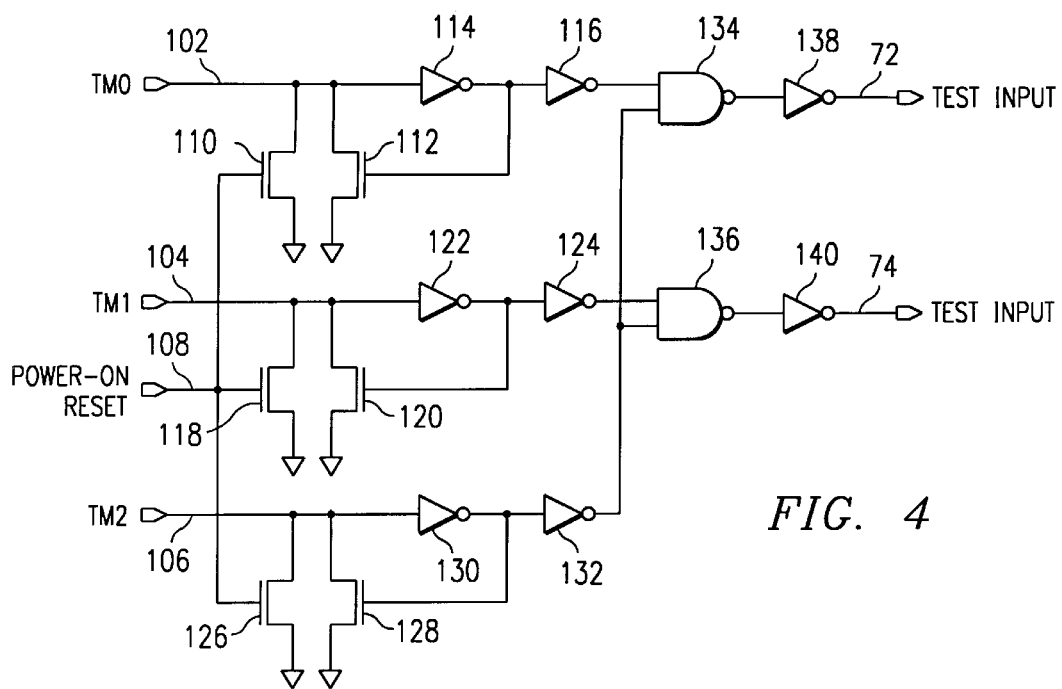
FIG. 4 is a test mode logic circuit that may be used to control the test input signals of FIG. 3, according to the present invention.
Figure 5:
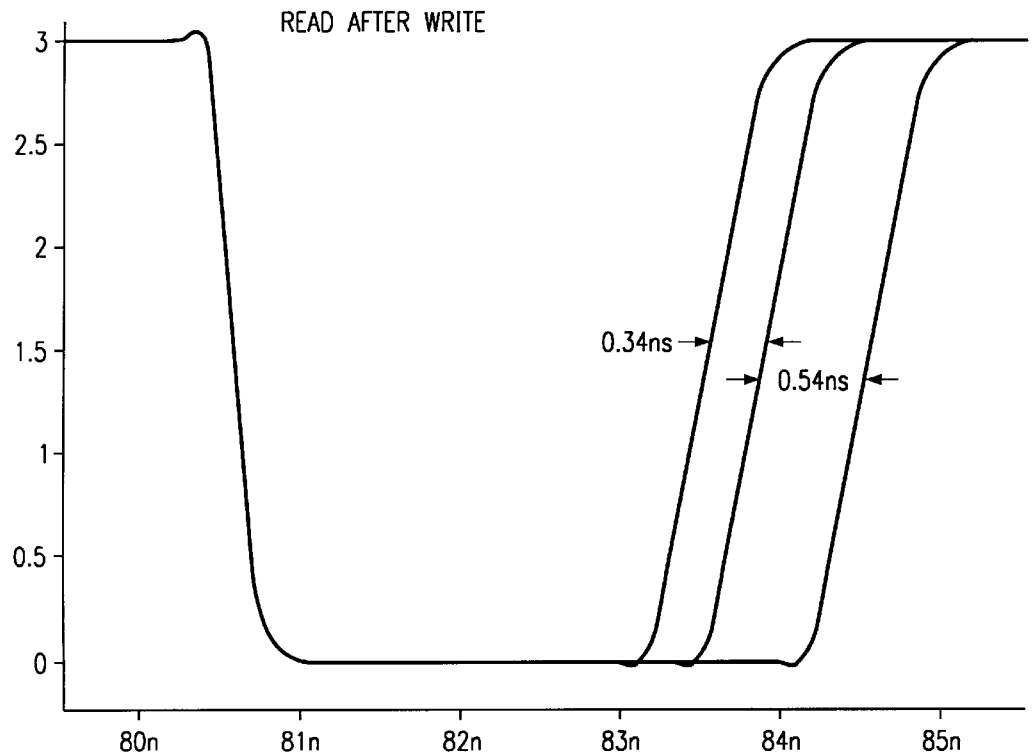
FIG. 5 is a waveform illustrating the varying pulse widths of the ETD-chip signal produced by FIG. 3 in response to varying combinations of test input signals, according to the present invention.

FIG. 4 illustrates the test mode logic 100 that may be used to control Test Input0 signal 72 and Test Input1 signal 74. As shown in the figure, test mode logic 100 receives test mode signals TM0, TM1, and TM2 and Power-On Reset signal 108. Power-on Reset signal 108 ensures the state of the pads that receive test mode signals TM0, TM1, TM2 upon power-up such that the pads do not have to be bonded to the memory device package. Decoding logic represented by inverters 110, 112, 118, 120, 126, 128, inverters 114, 116, 122, 124, 130, 132, 138, 140, and NAND logic gates 134, 136 determine the states of Test Input0 signal 72 and Test Input1 signal 74. When either test mode signal TM1 or TM2 is low, then Test Input1 signal 74 is low, prompting ETD-chip signal 99 of FIG. 3 to be the minimum pulse width. However, when test mode signal TM0 is low but test mode signals TM1 and TM2 are high, then Test Input0 signal 72 is low and Test Input1 signal 74 is high, thereby prompting ETD-chip signal 99 of FIG. 3 to have a wider pulse width. The widest pulse width of ETD-chip signal 99 is accomplished only when all three test mode signals TM0, TM1, TM2 are high logic states, thereby causing Test Input0 signal 72 and Test Input1 signal 74 to also both be high logic states. Referring to FIG. 5, a waveform showing the three pulse widths of ETD-chip signal 99 produced by FIG. 3 in response to varying combinations of Test Input0 signal 72 and Test Input1 signal 74 is shown.

While three test mode signals, TM0, TM1, and TM2, are shown, it is contemplated that only one test mode signal is required for operation of the invention; of course, using multiple test mode signals allows for more pulse width selectivity. Consider, for example, that test mode signal TM2 could be eliminated from FIG. 4 and logic gates 134 and 136 would be replaced with inverters. Additionally, it will be appreciated by one of skill in the art that the delay associated with the completion of the ETD pulse may be varied by blowing or not blowing fuses. For instance, in FIG. 4, either or both of test mode signals TM0 and TM1 could be tied to Vcc by means of a fuse that could be selectively blown. Such fuses could be selectively blown based upon speed or yield considerations of the memory device.

While the invention has been particularly shown and described with reference to a preferred embodiment, it will be understood by those skilled in the art that various changes in form and detail may be made therein without departing from the spirit and scope of the invention.

What is claimed is:

1. A method of generating a selectably variable device edge transition detection device signal of a memory device, comprising the steps of:
   generating a plurality of edge transition detection signals of the memory device;
   combining the plurality of edge transition detection signals together to form an edge transition detection bus; and
   generating a device edge transition detection signal of the device, having a selectably variable pulse width, from the edge transition detection bus in accordance with a plurality of control signals, wherein the pulse width of the device edge transition detection signal is selectably varied by varying the logic state of one or more control signals of the plurality of control signals.

2. The method of claim 1, wherein in accordance with the step of generating the plurality of edge transition detection signals, each input buffer of the memory device generates an edge transition detection signal of the plurality of edge transition detection signals.

3. The method of claim 1, wherein the step of combining the plurality of edge transition detection signals to form the edge transition detection bus is accomplished by a wire-configuration of the plurality of edge transition detection signals.

4. The method of claim 1, wherein after the step of combining the plurality of edge transition detection signals together to form an edge transition detection bus, comprising the further step of:

generating a plurality of control signals.

5. The method of claim 4, wherein the plurality of control signals are generated by a decoding circuit.

6. The method of claim 1, wherein the pulse width of the device edge transition detection signal is selectably varied by a feedback path of the memory device that recovers the edge transition detection bus and that has a state of the edge transition detection bus as an input signal.

7. The method of claim 6, wherein the pulse width of the device edge transition detection signal is selectably varied according to a plurality of gates of the feedback path that are controlled to be active or inactive by the one or more control signals of the plurality of control signals.

8. A method of generating a selectably variable device edge transition detection device signal of a memory device, comprising the steps of:

generating a plurality of edge transition detection signals of the memory device;

combining a first portion of the plurality of edge transition detection signals to generate a first edge transition detection bus and combining a second portion of the plurality of edge transition detection signals to generate a second edge transition detection bus; and generating a device edge transition detection signal of the device, having a selectably variable pulse width, from the first edge transition detection bus and the second edge transition detection bus in accordance with a plurality of control signals, wherein the pulse width of the device edge transition detection signal is selectably varied by varying the logic state of one or more control signals of the plurality of control signals.

9. The method of claim 8, wherein in accordance with the step of generating the plurality of edge transition detection signals, each input buffer of the memory device generates an edge transition detection signal of the plurality of edge transition detection signals.

10. The method of claim 8, wherein the step of combining the first portion of the plurality of edge transition detection signals to form the first edge transition detection bus is accomplished by a wire-configuration of the edge transition detection signals of the first portion of the plurality of edge transition detection signals and wherein the step of combining the second portion of the plurality of edge transition detection signals to form the second edge transition detection bus is accomplished by a wire-configuration of the edge transition detection signals of the second portion of the plurality of edge transition detection signals.

11. The method of claim 8, wherein the first edge transition detection bus is representative of the edge transition detection signals of a first portion of the memory device and wherein the second edge transition detection bus is representative of the edge transition detection signals of a second portion of the memory device.

12. The method of claim 11, wherein the first portion of the memory device is the left portion of the memory device and wherein the second portion of the memory device is the right portion of the memory device.

13. The method of claim 8, wherein after the step of combining the first portion of the plurality of edge transition detection signals to generate the first edge transition detection bus and combining the second portion of the plurality of edge transition detection signals to generate the second edge transition detection bus, comprising the further step of:

generating a plurality of control signals.

14. The method of claim 13, wherein the plurality of control signals are generated by a decoding circuit.

15. The method of claim 8, wherein the pulse width of the device edge transition detection signal is selectably varied by a feedback path of the memory device that recovers the first edge transition detection bus and the second edge transition detection bus and that has a state of the edge transition detection bus as an input signal.

16. The method of claim 15, wherein the pulse width of the device edge transition detection signal is selectably varied according to a plurality of gates of the feedback path that are controlled to be active or inactive by the one or more control signals of the plurality of control signals.

17. A structure of a memory device that generates a selectable variable edge transition detection signal of the memory device, comprising:

a plurality of input buffer circuits of the memory device, wherein each input buffer circuit of the plurality of input buffer circuits generates an edge transition detection signal of a plurality of edge transition detection signals given an input signal;

means for combining the plurality of edge transition detection signals to form an edge transition detection bus; and an edge transition detection driver circuit, having a plurality of control signals and the edge transition detection bus as input signals, that generates a device edge transition detection signal, having a selectably variable pulse width, from the edge transition detection bus in accordance with the plurality of control signals, wherein the pulse width of the device edge transition detection signal is selectably varied by varying the logic state of one or more control signals of the plurality of control signals.

18. The structure of claim 17, wherein each input buffer circuit of the plurality of input buffer circuits comprises:

a delay element that receives the input signal and generates an output signal; and a logic element, having the input signal and the output signal generated by the delay element as input signals, that generates the edge transition detection signal.

19. The structure of claim 17, wherein when a first control signal of the plurality of control signals is equal to a first logic state, a first pulse width of the device edge transition detection signal is defined; when the first control signal of the plurality of control signals is equal to a second logic state and a second control signal of the plurality of control signals is equal to the first logic state, a second pulse width of the device edge transition detection signal that is wider than the first pulse width is defined; and when the first control signal and the second control signal are the second logic state, a third pulse width of the device edge transition detection signal that is wider than the second pulse width is defined.

20. The structure of claim 17, further comprising:
a feedback path of the edge transition detection driver circuit, having a plurality of gates that are controlled to be active or inactive by the one or more control signals of the plurality of control signals and having a state of the edge transition detection bus as an input signal, that recovers the edge transition detection bus, wherein the pulse width of the device edge transition detection signal is selectably varied by the feedback path according to the number of gates of the plurality of gates of the feedback path that are controlled to be active or inactive by the one or more control signals.

21. A structure of a memory device that generates a selectable variable edge transition detection signal of the memory device, comprising:
a plurality of input buffer circuits of the memory device, wherein each input buffer circuit of the plurality of input buffer circuits generates an edge transition detection signal of a plurality of edge transition detection signals given an input signal;
means for combining the plurality of edge transition detection signals to form an edge transition detection bus; and
an edge transition detection driver circuit, having a plurality of control signals and the edge transition detection bus as input signals, that generates a device edge transition detection signal, having a selectably variable pulse width, from the edge transition detection bus in accordance with the plurality of control signals, wherein the pulse width of the device edge transition detection signal is selectably varied by varying the logic state of one or more control signals of the plurality of control signals,
wherein when a first control signal of the plurality of control signals is equal to a first logic state, a first pulse width of the device edge transition detection signal is defined; when the first control signal of the plurality of control signals is equal to a second logic state and a second control signal of the plurality of control signals is equal to the first logic state, a second pulse width of the device edge transition detection signal that is wider than the first pulse width is defined; and when the first control signal and the second control signal are the second logic state, a third pulse width of the device edge transition detection signal that is wider than the second pulse width is defined.

22. The structure of claim 21, wherein each input buffer circuit of the plurality of input buffer circuits comprises:
a delay element that receives the input signal and generates an output signal; and
a logic element, having the input signal and the output signal generated by the delay element as input signals, that generates the edge transition detection signal.

23. The structure of claim 21, further comprising:
a feedback path of the edge transition detection driver circuit, having a plurality of gates that are controlled to be active or inactive by the one or more control signals of the plurality of control signals and having a state of the edge transition detection bus as an input signal, that recovers the edge transition detection bus, wherein the pulse width of the device edge transition detection signal is selectably varied by the feedback path according to the number of gates of the plurality of gates of the feedback path that are controlled to be active or inactive by the one or more control signals.

24. A structure of a memory device that generates a selectable variable edge transition detection signal of the memory device, comprising:
a plurality of input buffer circuits of the memory device, wherein each input buffer circuit of the plurality of input buffer circuits generates an edge transition detection signal of a plurality of edge transition detection signals given an input signal;
means for combining the plurality of edge transition detection signals to form an edge transition detection bus;
a decoding circuit, having a plurality of test mode signals as input signals, that generates a plurality of control signals, wherein the logic state of the plurality is determined by the logic states of the plurality of test mode signals; and
an edge transition detection driver circuit, having the plurality of control signals and the edge transition detection bus as input signals, that generates a device edge transition detection signal, having a selectably variable pulse width, from the edge transition detection bus in accordance with the plurality of control signals, wherein the pulse width of the device edge transition detection signal is selectably varied by varying the logic state of one or more control signals of the plurality of control signals.

25. The structure of claim 24, wherein each input buffer circuit of the plurality of input buffer circuits comprises:
a delay element that receives the input signal and generates an output signal; and
a logic element, having the input signal and the output signal generated by the delay element as input signals, that generates the edge transition detection signal.

26. The structure of claim 24, wherein when a first control signal of the plurality of control signals is equal to a first logic state, a first pulse width of the device edge transition detection signal is defined; when the first control signal of the plurality of control signals is equal to a second logic state and a second control signal of the plurality of control signals is equal to the first logic state, a second pulse width of the device edge transition detection signal that is wider than the first pulse width is defined; and when the first control signal and the second control signal are the second logic state, a third pulse width of the device edge transition detection signal that is wider than the second pulse width is defined.

27. The structure of claim 24, further comprising:
a feedback path of the edge transition detection driver circuit, having a plurality of gates that are controlled to be active or inactive by the one or more control signals of the plurality of control signals and having a state of the edge transition detection bus as an input signal, that recovers the edge transition detection bus, wherein the pulse width of the device edge transition detection signal is selectably varied by the feedback path according to the number of gates of the plurality of gates of the feedback path that are controlled to be active or inactive by the one or more control signals.

28. A structure of a memory device that generates a selectable variable edge transition detection signal of the memory device, comprising:
a plurality of input buffer circuits, wherein each input buffer circuit of the plurality of input buffer circuits generates an edge transition detection signal of a plurality of edge transition detection signals given an input signal;
means for combining a first portion of the plurality of edge transition detection signals to form a first edge transition detection bus;
means for combining a second portion of the plurality of edge transition detection signals to form a second edge transition detection bus; and an edge transition detection driver circuit, having a plurality of control signals and the edge transition detection bus as input signals, that generates a device edge transition detection signal, having a selectably variable pulse width, from the first edge transition detection bus and the second edge transition detection bus in accordance with the plurality of control signals, wherein the pulse width of the device edge transition detection signal is selectably varied by varying the logic state of one or more control signals of the plurality of control signals.

29. The structure of claim 28, wherein each input buffer circuit of the plurality of input buffer circuits comprises:
  a delay element that receives the input signal and generates an output signal; and
  a logic element, having the input signal and the output signal generated by the delay element as input signals, that generates the edge transition detection signal.

30. The structure of claim 28, wherein the means for combining the first portion of the plurality of edge transition detection signals to form the first edge transition detection bus is accomplished by a wire-configuration of the edge transition detection signals of the first portion of the plurality of edge transition detection signals and wherein the means for combining the second portion of the plurality of edge transition detection signals to form the second edge transition detection bus is accomplished by a wire-configuration of the edge transition detection signals of the second portion of the plurality of edge transition detection signals.

31. The structure of claim 28, wherein the first edge transition detection bus is representative of the edge transition detection signals produced by the input buffer circuits of a first portion of the memory device and wherein the second edge transition detection bus is representative of the edge transition detection signals produced by the input buffer circuits of a second portion of the memory device.

32. The structure of claim 31, wherein the first portion of the memory device is the left portion of the memory device and wherein the second portion of the memory device is the right portion of the memory device.

33. The structure of claim 28, wherein when a first control signal of the plurality of control signals is equal to a first logic state, a first pulse width of the device edge transition detection signal is defined; when the first control signal of the plurality of control signals is equal to a second logic state and a second control signal of the plurality of control signals is equal to the first logic state, a second pulse width of the device edge transition detection signal that is wider than the first pulse width is defined; and when the first control signal and the second control signal are the second logic state, a third pulse width of the device edge transition detection signal that is wider than the second pulse width is defined.

34. The structure of claim 28, further comprising:
  a feedback path of the edge transition detection driver circuit, having a plurality of gates that are controlled to be active or inactive by the one or more control signals of the plurality of control signals and having a state of the first edge transition detection bus and a state of the second edge transition detection bus as input signals, that recovers the first edge transition detection bus and the second edge transition detection bus, wherein the pulse width of the device edge transition detection signal is selectably varied by the feedback path according to the number of gates of the plurality of gates of the feedback path that are controlled to be active or inactive by the one or more control signals.

35. A structure of a memory device that generates a selectable variable edge transition detection signal of the memory device, comprising:

a plurality of input buffer circuits, wherein each input buffer circuit of the plurality of input buffer circuits generates an edge transition detection signal of a plurality of edge transition detection signals given an input signal;
  means for combining a first portion of the plurality of edge transition detection signals to form a first edge transition detection bus;
  means for combining a second portion of the plurality of edge transition detection signals to form a second edge transition detection bus; and
  an edge transition detection driver circuit, having a plurality of control signals and the edge transition detection bus as input signals, that generates a device edge transition detection signal, having a selectably variable pulse width, from the first edge transition detection bus and the second edge transition detection bus in accordance with the plurality of control signals, wherein the pulse width of the device edge transition detection signal is selectably varied by varying the logic state of one or more control signals of the plurality of control signals,
  wherein when a first control signal of the plurality of control signals is equal to a first logic state, a first pulse width of the device edge transition detection signal is defined; when the first control signal of the plurality of control signals is equal to a second logic state and a second control signal of the plurality of control signals is equal to the first logic state, a second pulse width of the device edge transition detection signal that is wider than the first pulse width is defined; and when the first control signal and the second control signal are the second logic state, a third pulse width of the device edge transition detection signal that is wider than the second pulse width is defined.

36. The structure of claim 35, wherein each input buffer circuit of the plurality of input buffer circuits comprises:
  a delay element that receives the input signal and generates an output signal; and
  a logic element, having the input signal and the output signal generated by the delay element as input signals, that generates the edge transition detection signal.

37. The structure of claim 35, wherein the means for combining the first portion of the plurality of edge transition detection signals to form the first edge transition detection bus is accomplished by a wire-configuration of the edge transition detection signals of the first portion of the plurality of edge transition detection signals and wherein the means for combining the second portion of the plurality of edge transition detection signals to form the second edge transition detection bus is accomplished by a wire-configuration of the edge transition detection signals of the second portion of the plurality of edge transition detection signals.

38. The structure of claim 35, wherein the first edge transition detection bus is representative of the edge transition detection signals produced by the input buffer circuits of a first portion of the memory device and wherein the second edge transition detection bus is representative of the edge transition detection signals produced by the input buffer circuits of a second portion of the memory device.

39. The structure of claim 38, wherein the first portion of the memory device is the left portion of the memory device and wherein the second portion of the memory device is the right portion of the memory device.

40. The structure of claim 35, further comprising:
  a feedback path of the edge transition detection driver circuit, having a plurality of gates that are controlled to be active or inactive by the one or more control signals of the plurality of control signals and having a state of the first edge transition detection bus and a state of the second edge transition detection bus as input signals, that recovers the first edge transition detection bus and the second edge transition detection bus, wherein the pulse width of the device edge transition detection signal is selectably varied by the feedback path according to the number of gates of the plurality of gates of the feedback path that are controlled to be active or inactive by the one or more control signals.

41. A structure of a memory device that generates a selectable variable edge transition detection signal of the memory device, comprising:

a plurality of input buffer circuits, wherein each input buffer circuit of the plurality of input buffer circuits generates an edge transition detection signal of a plurality of edge transition detection signals given an input signal;

means for combining a first portion of the plurality of edge transition detection signals to form a first edge transition detection bus;

means for combining a second portion of the plurality of edge transition detection signals to form a second edge transition detection bus;

a decoding circuit, having a plurality of test mode signals as input signals, that generates a plurality of control signals, wherein the logic state of the plurality is determined by the logic states of the plurality of test mode signals; and an edge transition detection driver circuit, having the plurality of control signals and the edge transition detection bus as input signals, that generates a device edge transition detection signal, having a selectably variable pulse width, from the first edge transition detection bus and the second edge transition detection bus in accordance with the plurality of control signals, wherein the pulse width of the device edge transition detection signal is selectably varied by varying the logic state of one or more control signals of the plurality of control signals.

42. The structure of claim 41, wherein each input buffer circuit of the plurality of input buffer circuits comprises:

a delay element that receives the input signal and generates an output signal; and a logic element, having the input signal and the output signal generated by the delay element as input signals, that generates the edge transition detection signal.

43. The structure of claim 41, wherein the means for combining the first portion of the plurality of edge transition detection signals to form the first edge transition detection bus is accomplished by a wire-configuration of the edge transition detection signals of the first portion of the plurality of edge transition detection signals and wherein the means for combining the second portion of the plurality of edge transition detection signals to form the second edge transition detection bus is accomplished by a wire-configuration of the edge transition detection signals of the second portion of the plurality of edge transition detection signals.

44. The structure of claim 41, wherein the first edge transition detection bus is representative of the edge transition detection signals produced by the input buffer circuits of a first portion of the memory device and wherein the second edge transition detection bus is representative of the edge transition detection signals produced by the input buffer circuits of a second portion of the memory device.

45. The structure of claim 44, wherein the first portion of the memory device is the left portion of the memory device and wherein the second portion of the memory device is the right portion of the memory device.

46. The structure of claim 41, wherein when a first control signal of the plurality of control signals is equal to a first logic state, a first pulse width of the device edge transition detection signal is defined; when the first control signal of the plurality of control signals is equal to a second logic state and a second control signal of the plurality of control signals is equal to the first logic state, a second pulse width of the device edge transition detection signal that is wider than the first pulse width is defined; and when the first control signal and the second control signal are the second logic state, a third pulse width of the device edge transition detection signal that is wider than the second pulse width is defined.

47. The structure of claim 41, further comprising:

a feedback path of the edge transition detection driver circuit, having a plurality of gates that are controlled to be active or inactive by the one or more control signals of the plurality of control signals and having a state of the first edge transition detection bus and a state of the second edge transition detection bus as input signals, that recovers the first edge transition detection bus and the second edge transition detection bus, wherein the pulse width of the device edge transition detection signal is selectably varied by the feedback path according to the number of gates of the plurality of gates of the feedback path that are controlled to be active or inactive by the one or more control signals.

* * * * *